US008605211B2

(12) United States Patent
Webster et al.

(10) Patent No.: US 8,605,211 B2
(45) Date of Patent: Dec. 10, 2013

(54) LOW RISE CAMERA MODULE

(75) Inventors: Steven Webster, Palo Alto, CA (US); Thomas B. Templeton, San Francisco, CA (US)

(73) Assignee: Apple Inc., Cupertino, CA (US)

(*) Notice: Subject to any disclaimer, the term of this patent is extended or adjusted under 35 U.S.C. 154(b) by 127 days.

(21) Appl. No.: 13/096,659

(22) Filed: Apr. 28, 2011

(65) Prior Publication Data

US 2012/0276951 A1    Nov. 1, 2012

(51) Int. Cl.
*H04N 5/225* (2006.01)

(52) U.S. Cl.
USPC ........................................... 348/374; 348/342

(58) Field of Classification Search
None
See application file for complete search history.

(56) References Cited

U.S. PATENT DOCUMENTS

| | | | |
|---|---|---|---|
| 5,869,896 A | 2/1999 | Baker et al. | |
| 6,144,507 A | 11/2000 | Hashimoto | |
| 6,784,534 B1 * | 8/2004 | Glenn et al. | 257/704 |
| 7,268,799 B2 * | 9/2007 | Patino et al. | 348/14.01 |
| 7,729,606 B2 * | 6/2010 | Webster et al. | 396/144 |
| 7,786,567 B2 | 8/2010 | Wang | |
| 7,812,433 B2 * | 10/2010 | Cheng et al. | 257/680 |
| 2003/0223008 A1 * | 12/2003 | Kim et al. | 348/340 |
| 2004/0041938 A1 * | 3/2004 | Seo et al. | 348/340 |
| 2004/0150740 A1 * | 8/2004 | Hsin | 348/340 |
| 2005/0024529 A1 * | 2/2005 | Kurosawa | 348/375 |
| 2006/0006486 A1 | 1/2006 | Seo et al. | |
| 2006/0061889 A1 * | 3/2006 | Tan et al. | 359/820 |
| 2006/0170811 A1 * | 8/2006 | Joung | 348/342 |
| 2006/0273249 A1 * | 12/2006 | Webster et al. | 250/239 |
| 2007/0075324 A1 * | 4/2007 | Minamio et al. | 257/98 |
| 2008/0252771 A1 * | 10/2008 | Wu | 348/340 |
| 2008/0274579 A1 | 11/2008 | Yang et al. | |
| 2009/0045476 A1 * | 2/2009 | Peng et al. | 257/432 |
| 2010/0182498 A1 * | 7/2010 | Niwa et al. | 348/374 |
| 2011/0109791 A1 * | 5/2011 | Obara et al. | 348/374 |
| 2011/0175182 A1 * | 7/2011 | Chen et al. | 257/432 |
| 2011/0267535 A1 * | 11/2011 | Seo et al. | 348/374 |

\* cited by examiner

*Primary Examiner* — Lin Ye
*Assistant Examiner* — Wesley J Chiu
(74) *Attorney, Agent, or Firm* — Blakely, Sokoloff, Taylor & Zafman LLP

(57) ABSTRACT

A printed circuit carrier has an opening therein against which a back plate is attached to thereby form a cavity. An image sensor device is attached to the back plate inside the cavity. The height of the image sensor device is about equal to or less than the height of the cavity. Electrical signal connections are formed between the image sensor device and the printed circuit carrier. A cap is attached directly to the carrier by a flowable adhesive layer, to seal off the cavity. Other embodiments are also described and claimed.

16 Claims, 3 Drawing Sheets

LOW RISE CAMERA MODULE

An embodiment of the invention relates to a camera module that may be integrated within a mobile electronic device such as a smartphone. Other embodiments are also described.

BACKGROUND

Camera modules have been incorporated in a variety of consumer electronics, such as cellular telephones, mobile audio players, personal digital assistants, and desktop personal computers. A typical camera module is an assembly in which at least the following components may be integrated: a microelectronic image sensor chip, a heat sink plate, a printed circuit carrier such as a flexible circuit structure which forms power and signal connections between the chip and other circuitry inside the device, and an optical system (e.g., a zoom lens, an auto focus subsystem). The image sensor chip may be bonded to the heat sink and is positioned with an opening formed in the printed circuit carrier. While the heat sink plate is flush against the back face of the carrier, the image sensor chip is tall and thus protrudes above the front face of the carrier. To protect the relatively delicate image sensor chip (including in particular its light sensitive array of photocells) from physical damage and exposure to dust and moisture, a relatively tall frame is bonded to the front face of the carrier and that surrounds the protruding image sensor chip. A cover glass (or other suitable, light transparent protective plate) is then bonded to the frame thereby sealing off the interior cavity in which the chip is located. However, this combined structure as used in a camera module may be too tall for certain short profile devices such as smartphones and tablet computers. Hence, there is a need for a low rise camera module.

SUMMARY

A low rise digital camera module suitable for a short profile mobile electronic device is described. The camera module includes a printed circuit carrier having an opening therein against which is attached to a back plate, to thereby form a cavity. An imaging sensor device is attached to the plate, and is located inside the cavity. Electrical signal connections are formed between the image sensor device and the carrier. The carrier and the image sensor device are sized such that the cavity formed by the combination of the plate and the opening in the carrier is deeper or taller than the height of the image sensor device. In other words, the image sensor device does not extend above the top face of the carrier (or outside the cavity). A cap (protective plate) is bonded directly to the top face of the carrier (along a periphery of the cavity), by a relatively thin strip of flowable adhesive, to seal off the cavity (and the image sensor chip therein). The camera module may also have an optical system integrated with the carrier (and the sealed off image sensor chip).

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

Embodiments of the invention will now be described with reference to the drawings summarized below. The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments of the invention with reference to the appended drawings are now explained. Whenever the shapes, relative positions, and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Figure 1:
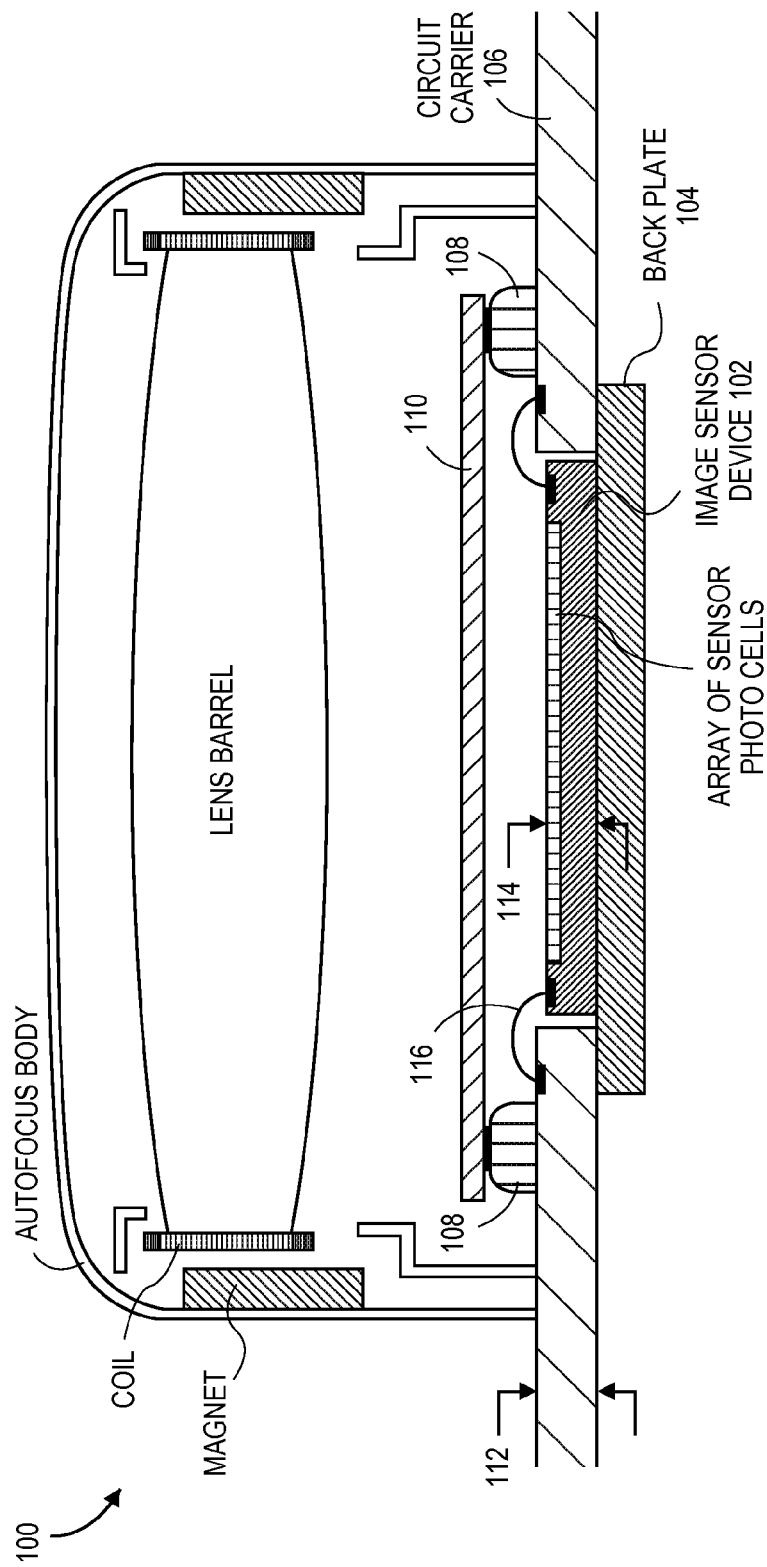
FIG. 1 shows a cut away side view of part of a low rise camera module according to an embodiment of the invention.

FIG. 1 shows a cut away side view of part of a low rise camera module 100 according to one embodiment of the invention. The low rise camera module 100 includes an image sensor device 102, a back plate 104, a printed circuit carrier 106, an adhesive layer 108, and a cap 110. An optical system including a conventional autofocus system may be attached as shown, to the top face of the carrier 106 and is optically aligned with the image sensor device 102. In addition, the optical system may include a zoom lens. Each of these elements will be described by way of example in the description that follows. These examples are merely illustrative and should not be construed as limiting.

Beginning with the back plate 104, this component or assembly serves to transfer heat generated within the image sensor device 102 away from the device 102 (as would a heat sink). A top surface of the back plate 104, which may directly contact a bottom face of the image sensor device 102 through a thermally conductive adhesive layer (not shown), may be substantially flat to conform with the bottom face of the device 102. Other areas of the back plate 104, including its bottom surface, may be flat or they may include ridges or fins such that heat dissipation increases. The back plate 104 may be formed of a variety of metals and metal alloys. For example, the back plate 104 may be formed of a single piece of aluminum alloy or it may be a combination of different layers of materials.

In one embodiment, the material selected for the back plate 104 should not only promote heat dissipation but also be stiff enough to ensure that the image sensor device 102 remains attached to it and firmly seated within the cavity shown in the figure, while the carrier 106 (and the module 100 as a whole) is handled during manufacturing or assembly of a larger "host" electronic device in which it is being integrated. Accordingly, the plate 104 in that case is rigidly constructed such that that the image sensor device 102 is not prone to flexing or movement relative to the plate 104 (once mounted on the plate 104).

Turning now to the image sensor device 102, this is a microelectronic circuit (integrated circuit) that converts light from a scene into digital signals (referred to as a digital image). The device may have an array of photocells of the charge-coupled device (CCD) type, complementary metaloxide-semiconductor (CMOS) active pixel sensor, or another similar photocell type technology. The array faces upwards on the top face of the device 102 (as shown in FIG. 1). The image sensor device 102 may be a single chip or die, and may be formed in various shapes. As shown, the image sensing device 102 is rectangular and is substantially longer and wider than tall; however, other shapes are possible. In addition to the array of photocells, the sensor device 102 may include analog to digital conversion circuitry, logic circuitry for resetting and reading the array, and a digital communication bus to transfer the digital images out of the device 102.

The image sensor device 102 is attached to the back plate 104 on its back or bottom face (where its front or top face exposes the photocell array to the light from the scene). The image sensor device 102 may be attached to the heat sink 104 using any suitable adhesive based or mechanical coupling technique. For example, in one embodiment the back face of the image sensor device 102 may be directly bonded to the top face of the plate 104 by a layer of thermally conductive adhesive. In other embodiments, the image sensing device 102 may be attached to the heat sink plate 104 using several distinct solder regions, latches, tie downs, or other similar mechanical coupling that securely fixes the image sensor device 102 to the plate 104. A layer of thermal grease or heat sink compound may be added directly in between the two, to improve heat transfer.

In one embodiment, the image sensor device 102 has a set of electrical power and signal interconnects that allow the device 102 to be powered by and communicate with other circuitry in the camera module 100 and/or in the host device to which the camera module 100 is connected or in which the camera module 100 is integrated. The electrical interconnects may be a number of contact pads or solder pads that lie on exposed surfaces or edges of a chip which constitutes the image sensor device 102. These pads provide designated areas for wire-bonding or otherwise providing a similar electrical connection between the image sensor device 102 and external circuitry. For example, as shown in FIG. 1, a wire strip 116 directly connects an electrical interconnect of the image sensor device 102 to a solder region in the top face of the carrier 106, in accordance with a conventional wire bonding technique. There are several more of such connections (not shown) formed between the image sensor device 102 and the carrier 106 through which power data (include the digital image) and control signals may pass.

Turning now to the carrier 106, this structure provides a conduit for electrical power and signals to pass to and from the image sensor device 102. FIG. 1 shows a portion of the carrier 106, which surrounds the image sensor device 102. The carrier 106 has a face-to-face hole or opening formed therein as shown, between the back plate 104 on one side and the cap 110 on the other. The hole may be formed in any shape to meet the dimensional requirements of the image sensor device 102, so that the latter can easily be positioned in the hole as shown. The carrier 106 may be a printed circuit board (PCB), a printed wiring board (PWB), or a flexible circuit, all of which electrically connect the image sensor device 102 to other circuitry using conductive pathways (generically referred to as "printed circuits", e.g. traces that may be etched from a copper sheet laminated onto a non-conductive substrate). The carrier 106 may be populated with other electronic components (not shown).

As seen in FIG. 1, the image sensor device 102 should be designed so that its height 114 is about equal to or less that the height 112 of the carrier 106 (near the hole where the image sensor device 102 is located. This will allow a shorter profile for the camera module 100, especially when the cap 110 is installed as desired below.

Turning now to the cap 110, this component is directly attached to the carrier 106 and provides a substantially clear barrier between the outside elements and the image sensor device 102. In one embodiment, the cap 110 is a piece of a sheet of glass or plastic that is relatively thin and substantially light transparent, to allow light from the scene to impinge on the array of photocells of the sensor device 102. The cap 110 may include one or more filters, e.g. an infrared cut filter. The cap 110 has area at least as large as that of the opening in the carrier 106. The cap 110 may be pressed against a flowable adhesive layer 108 that has been placed on or applied to the top face of the carrier 106, as a sealing and adhesive material. The flowable layer 108 may be a film or strip of epoxy or other adhesive that has been deposited, dispensed, printed or rolled onto the top face of the carrier 106, and that once cured forms a bond and a moisture seal between the top face of the carrier 106 and a bottom face of the cap 110. Although FIG. 1 depicts the flowable adhesive layer 108 as being entirely outside the region of wire strips 116, an alternative is to apply the adhesive layer further inward so as to overlap and partially cover, i.e. be in contact with, the wire strips 116.

Figure 2:
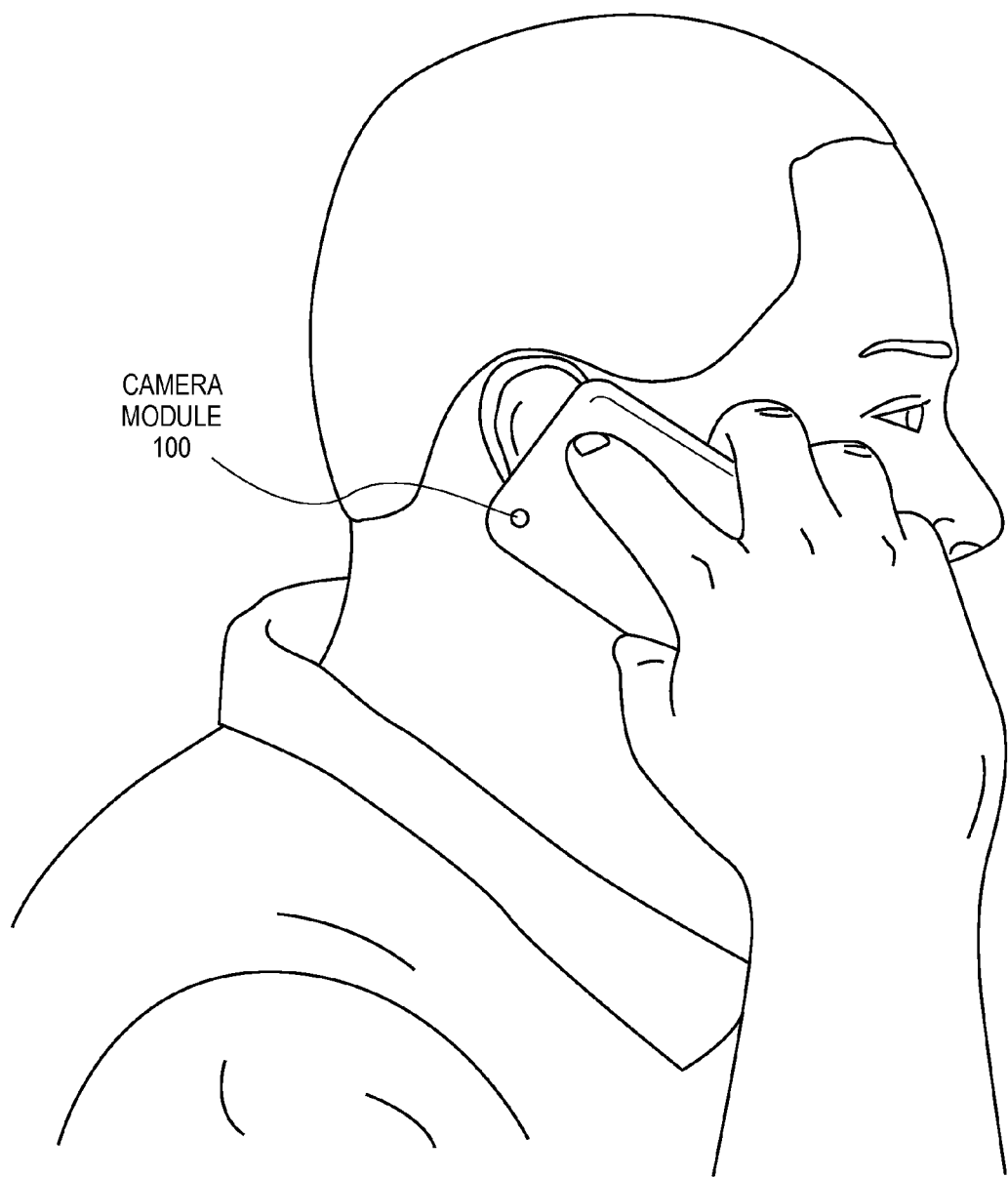
FIG. 2 shows a mobile phone device in use.

FIG. 2 is an example mobile phone device that is in use, and in which the camera module 100 has been integrated. The camera module 100 has been integrated, in this case into the back panel of a short profile, communications handset housing (that is being held in the user's hand). The housing contains conventional electronics as found in a typical mobile phone, e.g. a cellular network baseband processor that enables cellular phone calls. Other short profile host devices that can benefit from having the camera module 100 integrated therein include a tablet computer and a thin laptop or notebook computer.

Figure 3:
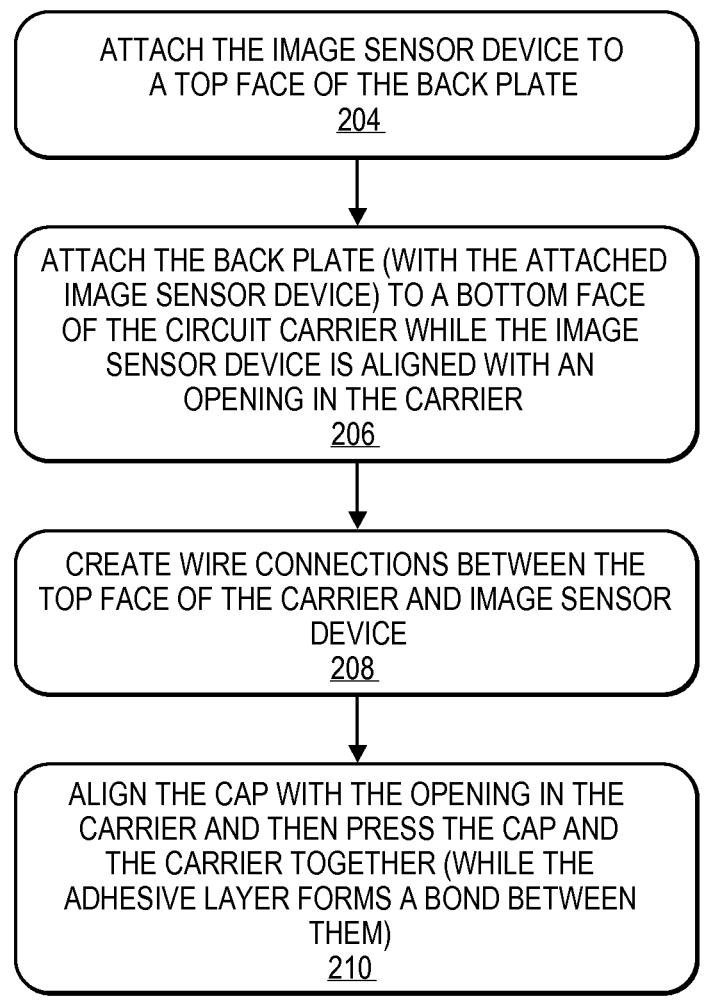
FIG. 3 is a flow diagram of a method for manufacturing the low rise camera module.

Turning now to FIG. 3, an example method 200 for manufacturing the low rise camera module 100 will now be described. Note that unless otherwise specified, the description of the operations in the method 200 does not imply an order. The process may begin with the creation of the back plate 104 as a separate piece. As described above, the plate 104 should have an area that is larger than that of an opening formed in the circuit carrier 106 in which the image sensor device 102 is to be located. The circuit carrier provides the needed electrical power and signal routing to the image sensor device 102 and has the needed solder pads or other suitable electrical interconnects on its front face, just outside the periphery of the opening, to provide the electrical connections, by way of wire bonding for example, to the image sensor device 102. The opening in the circuit carrier should be slightly larger than the area of the image sensor device 102. Also, the height of the circuit carrier should be no greater than that of the image sensor device 102, in order to yield the desired short profile for the camera module 100.

In one embodiment, the image sensor device 102 is first bonded to the top face of the plate 104 (operation 204), before the plate 104 is bonded to the bottom face of the circuit carrier 106 (operation 206). The latter of course should occur carefully while aligning the image sensor device 102 within the opening of the circuit carrier 106. Once the combination of the image sensor device 102 and plate 104 has been attached to the circuit carrier 106, the electrical connections (e.g., the wire strips 116) may be created to connect the solder pads of the image sensor device 102 to their respective solder pads or electrical contact regions in the top face of the carrier 106 (operation 208). At this point, the adhesive layer 108 may be applied to the top face of the carrier 106, in a manner that may or may not overlap or cover the wire bond connections (e.g., wire strips 116). The cap 100 is then aligned with the opening in the carrier and then pressed against the carrier (operation 210). The adhesive layer 108 should be applied as a continuous strip all around the opening in the carrier 106 in which the image sensor device 102 now resides. The layer 108 may be a relatively thin layer, namely one that is only thick enough to avoid damage to the wire bonds when the cap 110 is pressed onto the layer 108 to seal off the opening or cavity.

For purposes of explanation, specific embodiments were described to provide a thorough understanding of the present invention. These should not be construed as limiting the scope of the invention but merely as illustrating different examples and aspects of the invention. It should be appreciated that the scope of the invention includes other embodiments not discussed in detail above. Various other modifications, changes, and variations which will be apparent to those skilled in the art may be made in the arrangement, operation, and details of the systems and methods of the present invention disclosed herein without departing from the spirit and scope of the invention as defined in the appended claims. For instance, while FIG. 1 shows the back plate 104 being only slightly larger that the area of the opening formed in the circuit carrier 106, an alternative is to have the back plate 104 extend further in order to provide additional stiffness to the carrier 106 particularly in the case where the carrier 106 is a flex circuit. Also FIG. 2 recites the adhesive layer forming a bond. This may be achieved by first dispensing the adhesive layer onto the top face of the carrier and then bringing the cap into contact with the as applied adhesive layer; as an alternative, however, the adhesive could be applied just to the cap, before pressing the cap against the carrier. Therefore, the scope of the invention should be determined by the claims and their legal equivalents. Such equivalents include both currently known equivalents as well as equivalents developed in the future, i.e. any elements developed that perform the same function, regardless of structure. Furthermore, no element, component, or method step is intended to be dedicated to the public regardless of whether the element, component, or method step is explicitly recited in the claims.

What is claimed is:

1. A digital camera module, comprising:
    a metal back plate;
    a printed circuit carrier having an opening therein and a rear face against which a portion of the back plate is directly attached to thereby form a cavity, wherein the printed circuit carrier is created separately from the metal back plate;
    an image sensor device directly attached to the back plate and located inside the cavity, wherein the height of the image sensor device is equal to or less than the height of the cavity, and a plurality of electrical signal connections formed between the image sensor device and the printed circuit carrier; and
    a cap directly attached to a front face of the printed circuit carrier by a flowable adhesive layer to seal off the cavity, wherein the combination of the metal back plate attached to the rear face of the printed circuit carrier, the height of the cavity in the printed circuit carrier, and the use of the flowable adhesive layer to attach the cap directly to the front face of the printed circuit carrier together yields a shorter profile for the digital camera module.

2. The camera module of claim 1, further comprising a camera optical system integrated with the printed circuit carrier.

3. The camera module of claim 1, wherein the flowable adhesive layer is in contact with the plurality electrical signal connections.

4. The camera module of claim 1, wherein the electrical signal connections are wire bonds, and the flowable adhesive layer does not contact any of the wire bonds.

5. The camera module of claim 1, wherein the flowable adhesive layer completely surrounds the opening and does not contact any of the electrical signal connections.

6. The camera module of claim 1 wherein the circuit carrier is a flex circuit.

7. A mobile communications device, comprising:
    a handheld mobile phone housing in which are integrated a cellular network baseband processor and a digital camera module having a back metal plate, a printed circuit carrier having an opening therein and a rear face against which a portion of the back plate is directly attached to seal off the opening, an image sensor device directly attached to the back plate and located inside the opening, wherein the height of the image sensor device is equal to or less than the height of the opening, a plurality of electrical signal connections formed between the image sensor device and the printed circuit carrier, and a cap directly attached to a front face of the printed circuit carrier by a flowable adhesive layer m seal off the opening, wherein the combination of the metal back plate attached to the rear face of the printed circuit carrier, the height of the opening in the printed circuit carrier, and the use of the flowable adhesive layer to directly attach the cap to the front face of the printed circuit carrier together yields a shorter profile for the digital camera module.

8. The mobile communications device of claim 7, wherein the camera module further comprises a camera optical system integrated with the printed circuit carrier.

9. The mobile communications device of claim 7, wherein the flowable adhesive layer is in contact with the plurality electrical signal connections.

10. The mobile communications device of claim 7, wherein the electrical signal connections are wire bonds, and the flowable adhesive layer does not contact any of the wire bonds.

11. The mobile communications device of claim 7, wherein the flowable adhesive layer completely surrounds the opening and does not contact any of the electrical signal connections.

12. The mobile communications device of claim 7, wherein the circuit carrier is a flex circuit.

13. A method for manufacturing a camera module, comprising:
    attaching an image sensor device directly to a top face of a metal back plate;
    directly attaching a portion of the metal back plate, with the attached image sensor device, to a bottom face of a printed circuit carrier while the attached image sensor device is aligned with an opening in the printed circuit carrier so that the attached image sensor device is positioned within the opening, wherein the printed circuit carrier is created separately from the metal back plate;
    forming a plurality of power and signal wire connections between the printed circuit carrier and the image sensor device;
    and attaching a cap directly to a top surface of the carrier while the cap is aligned with the opening, wherein the combination of the metal back plate directly attached to the bottom face of the printed circuit carrier, the height of the image sensor device being no greater than that of the opening in the printed circuit carrier, and attaching the cap directly to the top face of the printed circuit using just a flowable adhesive layer together yields a shorter profile for the camera module.

14. The method of claim 13, wherein the wire connections are wire bonds each having one end attached directly to a top face of the printed circuit carrier and another end attached to a top face of the image sensor device.

15. The method of claim 13, further comprising applying a layer of thermal grease to be directly in contact with a bottom face of the image sensor device and a top face of the back plate.

16. The method of claim 13, wherein the flowable adhesive layer is applied onto the top face of the printed circuit carrier only, and the cap is then brought into contact with the as applied adhesive layer.

* * * * *